(12) United States Patent
Mostafazadeh et al.

(10) Patent No.: US 6,710,246 B1
(45) Date of Patent: Mar. 23, 2004

(54) APPARATUS AND METHOD OF MANUFACTURING A STACKABLE PACKAGE FOR A SEMICONDUCTOR DEVICE

(75) Inventors: Shahram Mostafazadeh, San Jose, CA (US); Joseph O. Smith, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/211,450

(22) Filed: Aug. 2, 2002

(51) Int. Cl.⁷ .............................................. H01L 23/02
(52) U.S. Cl. ........................ 174/52.3; 361/735; 257/686
(58) Field of Search ............................... 174/52.3, 52.4, 174/260; 361/729, 735, 790; 257/685, 686, 690, 723

(56) References Cited

U.S. PATENT DOCUMENTS

| | | | |
|---|---|---|---|
| 5,241,456 A | * | 8/1993 | Marcinkiewicz et al. ... 361/792 |
| 5,376,825 A | * | 12/1994 | Tukamoto et al. ........... 257/685 |
| 5,798,564 A | * | 8/1998 | Eng et al. .................... 257/686 |
| 6,020,629 A | * | 2/2000 | Farnworth et al. .......... 257/686 |
| 6,153,928 A | * | 11/2000 | Cho ............................. 257/686 |
| 6,326,544 B1 | * | 12/2001 | Lake .......................... 174/52.2 |
| 6,372,539 B1 | | 4/2002 | Bayan et al. |
| 6,381,141 B2 | * | 4/2002 | Corisis et al. ............... 361/735 |
| 6,399,415 B1 | | 6/2002 | Bayan et al. |
| 6,400,004 B1 | | 6/2002 | Fan et al. |
| 6,452,255 B1 | | 9/2002 | Bayan et al. |
| 6,524,886 B2 | | 2/2003 | Lee |
| 6,534,855 B1 | * | 3/2003 | Ahn et al. ................... 257/698 |
| 6,610,924 B1 | | 8/2003 | Lee et al. |
| 2002/0177256 A1 | | 11/2002 | Lee |
| 2003/0071333 A1 | | 4/2003 | Matsuzawa |
| 2003/0071344 A1 | | 4/2003 | Matsuzawa et al. |
| 2003/0082854 A1 | | 5/2003 | Kasahara et al. |
| 2003/0164535 A1 | | 9/2003 | Inatsugu |

FOREIGN PATENT DOCUMENTS

JP          2002-93982          3/2002

* cited by examiner

*Primary Examiner*—Dean A. Reichard
*Assistant Examiner*—Carmelo Oliva
(74) *Attorney, Agent, or Firm*—Beyer Weaver & Thomas, LLP

(57) ABSTRACT

A package, a method of making and a method of assembly of packages for semiconductor chips are disclosed. The package includes a die attach pad on which a semiconductor die is mounted. A lead is electrically connected to the semiconductor die which is encapsulated in packaging material. The lead is exposed at opposed sides of the package. Exposing the lead on both sides of the package allows the package to be stacked or assembled so that the leads of adjacent pairs of packages are in electrical contact. Making the semiconductor packages includes forming a piece of electrically conductive material into a die attach pad and at least one lead associated with the die attach pad. A semiconductor die is mounted on the die attach pad and an electrical connection is made between the semiconductor die and the lead. The package is formed by encapsulation with the lead exposed on opposite sides of the package.

15 Claims, 4 Drawing Sheets

APPARATUS AND METHOD OF MANUFACTURING A STACKABLE PACKAGE FOR A SEMICONDUCTOR DEVICE

FIELD OF THE INVENTION

The present invention relates generally to a package, and more particularly, to a stackable semiconductor device package, and related methods of manufacture and assembly.

BACKGROUND OF THE INVENTION

Current computer and signal processing systems are typically very complex and include a number of highly integrated semiconductor chips mounted on one or more printed circuit boards. Printed circuit boards typically include contacts that mate with corresponding contacts on the chip packages and electrical traces that provide electrical connections between contacts of different chips on the board or to external elements, such as power supplies, data input and output points, or even other circuit boards.

Market forces often require that consumer or other electronic products, such as cell phones, personal digital assistants, lap tops, etc, not only include more features, but be implemented in even smaller product sizes. This poses a number of serious problems for system designers.

Smaller products necessarily mean the circuit board or boards inside the product need to be smaller. With smaller boards, there is less real estate to "stuff" with integrated circuits. This problem is only exacerbated when new functionality requires the addition of more chips to the system.

SUMMARY OF THE INVENTION

A package, a method of making and a method of assembly of packages for semiconductor chips are disclosed. The package includes a die attach pad on which a semiconductor die is mounted. A first lead is electrically connected to the semiconductor die. Packaging material encapsulates the semiconductor die. The package has opposed sides, and the lead is exposed at the first and second sides. The exposed lead on the first and second sides allows the package to be stacked or assembled so that the leads of an adjacent pair of packages are in electrical contact.

The method of making the semiconductor packages includes forming a piece of electrically conductive material to form a die attach pad and at least one lead associated with the die attach pad. A semiconductor die is mounted on the die attach pad. An electrical connection is made between the semiconductor die and the lead. A package is formed by encapsulating the semiconductor die, connection and pad, with the lead exposed at opposite sides of the package.

BRIEF DESCRIPTION OF THE DRAWINGS

The invention, together with further advantages thereof, may best be understood by reference to the following description taken in conjunction with the accompanying drawings in which.

In the Figures, like reference numerals refer to like components and elements.

DETAILED DESCRIPTION OF THE INVENTION

Figure 1:
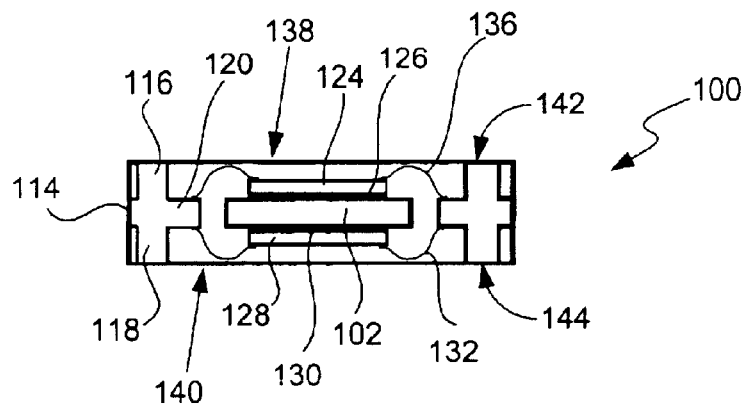
FIG. 1 is a schematic side view of package according to the present invention.
Figure 2:
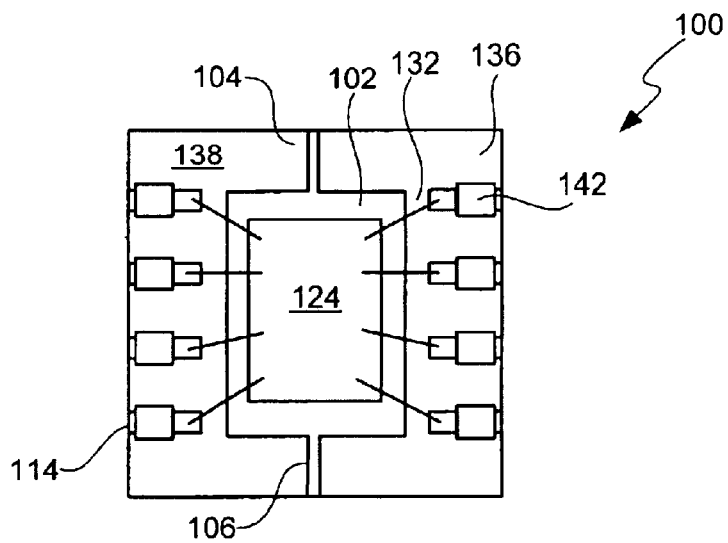
FIG. 2 is a schematic plan view of the package shown in FIG. 1.

The present invention relates to a semiconductor device package. FIGS. 1 and 2 respectively show schematic side and plan views of a package 100 according to an embodiment of the present invention. Package 100 includes a die attach pad 102 having a first side and a second side. Four leads are arranged along a first side of the package and towards the edge of the package and another four leads are arranged along a second opposed side of the package towards the edge of the package. Each lead 114 has a substantially T shape, with a lead tip 116, 118 at each end and a trunk 120 providing a bonding shelf for wires as will be described below. The die attach pad 102 and associated leads 110, 112 are fabricated from a single piece of copper as will also be described below. The die attach pad includes ties 104,106 which are artifacts from the lead frame used in manufacture of the packages. Ties 104,106 are not shown in FIG. 1 for the sake of clarity.

Although FIG. 2 shows leads along two sides of the package only, other lead arrangements can be used as appropriate. Leads can be provided around one, two, three or four sides of the package. Eight leads are shown in FIG. 2 for the sake of clarity. More or fewer leads can be used. In particular in some embodiments up to a very large number of leads can be used, depending on the number of leads required by a particular die. The leads are shown around the periphery of package 100, but they can be located at any suitable location within the package. A rectangular package geometry is shown in FIG. 2, but the package can have other shapes such as other polygons, including squares, or curved shapes, such as circles.

A first die 124 is mounted on the first side of the die attach pad 102 and secured in place using an epoxy 126. A suitable conductive epoxy is ABLESTIK 84-1 and a suitable non-conductive epoxy is ABLESTIK 84-3, both as provided by Ablestik Laboratories, California. A second die 128 is mounted on the second side of the die attach pad 102 and is also secured in place using the same epoxy 130. Dice 124, 128 are semiconductor, integrated circuit based devices which can provide various functionalities depending on the intended application of the package. An electrical connection is provided between the inputs and outputs of the dice and the leads 110, 112 by gold wire bonding 132 between the dice and the bonding shelf of each lead 114.

The package is encapsulated in a packaging material 136. In one embodiment of the package 100, the packaging material can be a mold compound such as EME 6300 or CR 720, as provided by Sumitomo Chemical Company Limited of Japan. In other embodiments in which one or more of the dice is sensitive to radiation, the encapsulating material is selected to be substantially transparent to the appropriate radiation. For example, in an embodiment for use in optical imaging applications, the encapsulating material is chosen to be one that is transparent to radiation in the visible light part of the light spectrum. A suitable encapsulating material would be a clear mold compound. In another embodiment for applications using infrared radiation, the encapsulating material is selected to be one that is transparent to light in the infrared part of the light spectrum. In other embodiments, the encapsulating material can be selected to be one that is substantially transparent to light in the invisible light parts of the light spectrum.

The package has a first surface 138 and a second surface 140 opposed to the first surface. Each lead 114 extends between the first 138 and second 140 surfaces of the package 100 and each end surface 142, 144 of each lead 114 is exposed at the first 138 and second 140 package surfaces.

Figure 3:
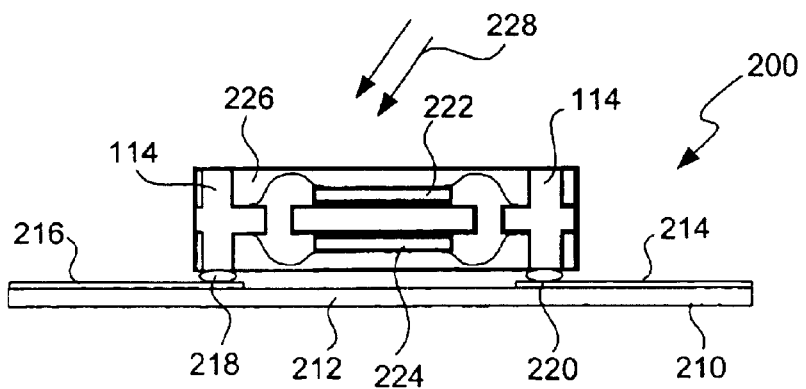
FIG. 3 shows a schematic side view of a package 200 mounted on a printed circuit board.

FIG. 3 shows a schematic side view of a package 200 mounted on a printed circuit board 210. The printed circuit board (PCB) 210 has a substrate 212 of FR4 on which is a complex pattern of electrically conducting copper tracks 214, 216 for carrying electrical signals to and from the package 200. In other embodiments, substrate 212 can be of tape, polyimide or ceramic materials. Connection terminals for the tracks are arranged on the PCB in a pattern corresponding to the pattern of the leads of the package. The package 200 is mounted on the PCB using solder 218, 220 or alternatively electrically conductive epoxy. Package 200 is configured for an imaging application and includes an imaging die 222 and an image data processing die 224. Encapsulation material 226 is substantially transparent to radiation 228 in the visible part of the electromagnetic spectrum.

An example application for package 200 could be as a video camera for a wireless communications device, such as a cellular telephone. Package 200 has a small footprint on the PCB and provides two semiconductor devices within that footprint. Some of the leads of the package can provide a common signal to the dice, e.g. a power supply signal, and so a reduced number of circuit board tracks can be used with the package. Hence the package facilitates miniaturization. Some of the leads can be dedicated to one or the other of the dice and the wire bonding pattern is selected so as to ensure that the correct input or output of the dice is electrically connected to the correct circuit board track via the appropriate lead 114. Some of the leads can be wire bonded to only a one of the dice, as appropriate.

In some embodiments a single die may be used in a package where the application is appropriate.

Figure 4:
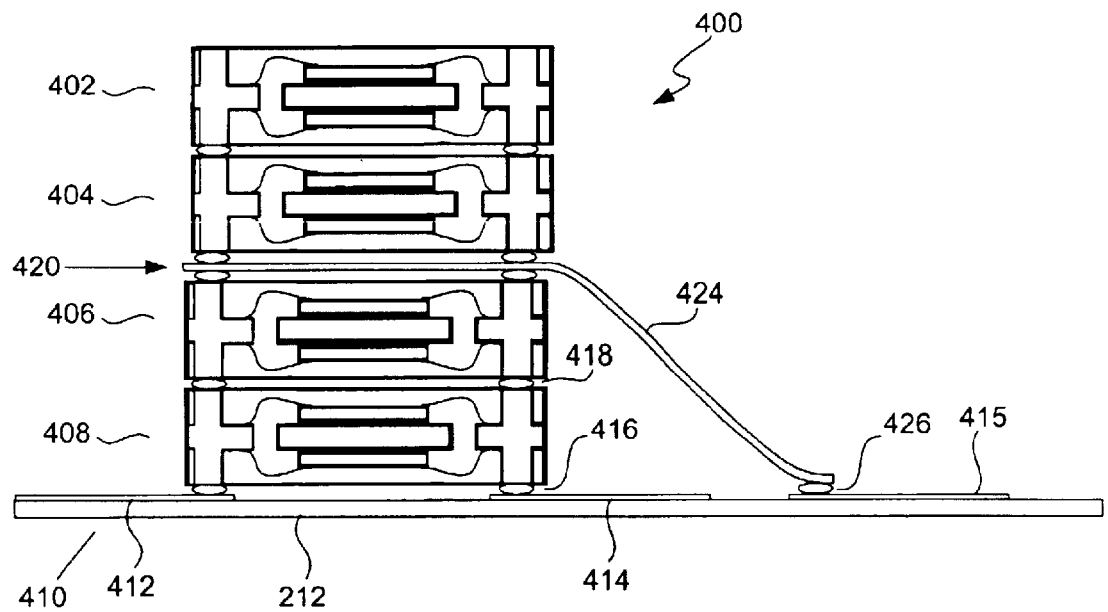
FIG. 4 is a schematic side view of an assembly of packages according to an aspect of the invention.

FIG. 4 shows a further embodiment illustrating aspects of the invention. FIG. 4 shows a stack 400 of four packages 402, 404, 406, 408 mounted on a printed circuit board 410. Each of the die in each package is a semiconductor memory device. The stack of packages therefore provides a high capacity memory within a small footprint. The fourth package 408 is connected to tracks 412, 414 on the PCB 410 by solder 416. The third package 406 is mounted on the bottom package 408 and secured in place by solder 418. An interface 420 is provided between the third 406 and second 404 packages. The interface 420 has a flexible substrate 424 comprising a strip or sheet of dielectric material, such as mylar, which has a pattern of conducting copper tracks on its upper and lower surfaces (not shown in FIG. 4 for the sake of clarity). The interface is connected to the third 406 and second 404 packages by solder between leads of the respective packages and terminals of the interface tracks. An end of the interface is electrically connected to PCB tracks 415 by solder 426 between interface track terminals and the PCB tracks 415. The leads of the first package 402 are soldered to the leads of the second package 404.

The end surfaces of the leads of the packages are exposed and the leads of adjacent pairs of packages are electrically connected by the solder. Other ways of connecting the stacked packages can be used. For example, electrically conductive epoxy could be used. Also, the packages could be fastened together with an adhesive between the bodies of the packages and with the leads directly contacting each other.

Any electrical signals common to all the dice, e.g. a power supply signal, can be provided to all the dice using a single lead so that the signal propagates up and down the stack using the same respective lead in each package. Those signals which are specific to a particular die or package can propagate up and down the stack using a particular vertical path of leads and appropriate wire bonding connections.

Interface 420 can provide a number of features. The pattern of tracks on the interface can be used to supply electrical signals across a package to different leads. For example, a track on the under side of the substrate 424 can pass through the substrate 424 and emerge on the upper side of the substrate thereby connecting different leads of the third 406 and second 404 packages. Other track patterns can be used at the interface so as to connect leads of the same package or different packages as required.

The interface 420 can also be used to allow electrical signals to be connected between packages of the stack and PCB tracks other than those to which the fourth package is connected. This allows signals to be supplied to a selected package or packages of the stack or to connect packages of the stack to other devices on the PCB. For example, PCB track 415 can be attached by solder 426 to a track on the substrate 424 of interface 420 which track is connected to a lead of the second package so that an electrical signal can be supplied to the second and/or first packages only. In one example embodiment, track 412 could be used to supply signals common to all the memory dice in the stack and track 414 could be used to supply signals from a first processing unit to the fourth and third packages and track 415 to supply signals from a second processing unit to the second and third packages. Such a configuration provides a stack of the memory with a reduced footprint and also helps to reduce the number of PCB tracks required by the stack of memory.

Figure 5:
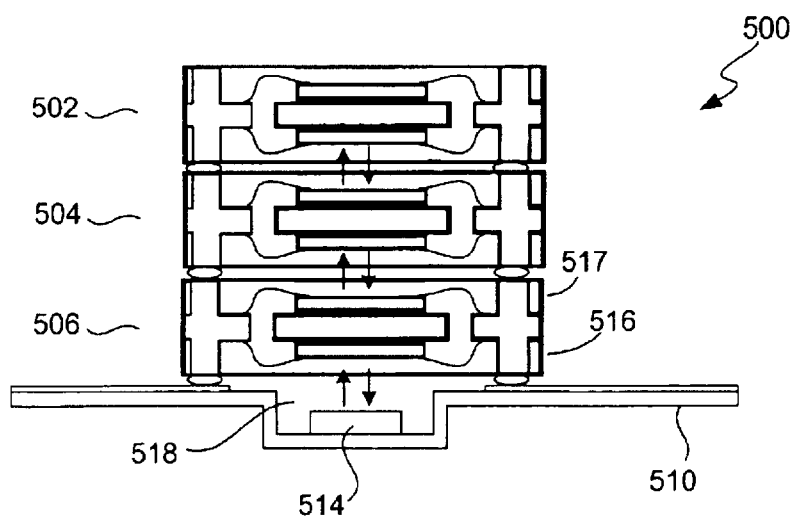
FIG. 5 is a schematic side view of an assembly of packages according to another embodiment of an aspect of the invention.

FIG. 5 shows a schematic side view of a further example embodiment of the invention. FIG. 5 shows a stacked assembly 500 of three packages 502, 504, 506 mounted on a PCB 510. In this embodiment, the packages in the stack can communicate both wirelessly and via electrical connection of the leads. An infrared transmitter and receiver device 514 is mounted in a recessed part of the PCB and aligned with the stack. Each of the dice 516 includes an infrared transmitter and receiver and the encapsulating material 517 is substantially infrared transparent at the wavelengths of the infrared radiation 518 used by the transmitters and receivers. A laser diode can be used as the transmitter and an image/IR sensor as the receiver. The transmitter and receiver devices can be provided as parts of the dice or separate to the dice and the dice can have other functionalities which process, store or otherwise utilize the data transmitted to them.

Electrical signals required by the dice can be supplied via the leads and data, and other information, can be transmitted at high rates between the dice of the stack by being encoded in the infrared signals. Hence, data required by the top package 502 can be transmitted to it from the PCB infrared transmitter/receiver device 514, by being relayed between the dice on the bottom 506 and middle 504 packages. High rate transmission of data between the packages using wireless communication obviates the problems associated with wire based connections at high rates, such as the wire impedance.

Figure 6:
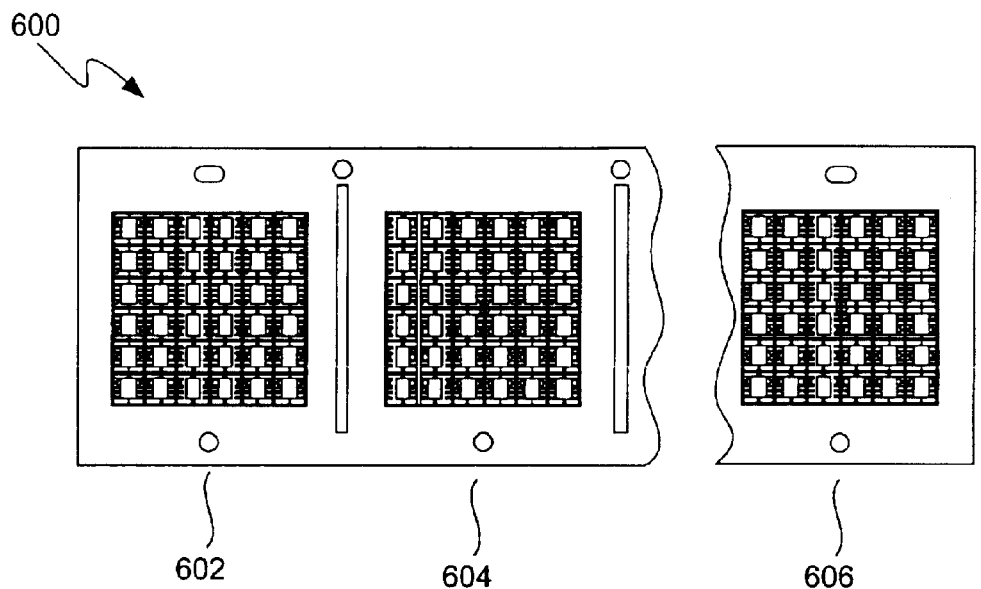
FIG. 6 is a schematic plan view of a lead frame strip used in a method aspect of the invention.
Figure 7:
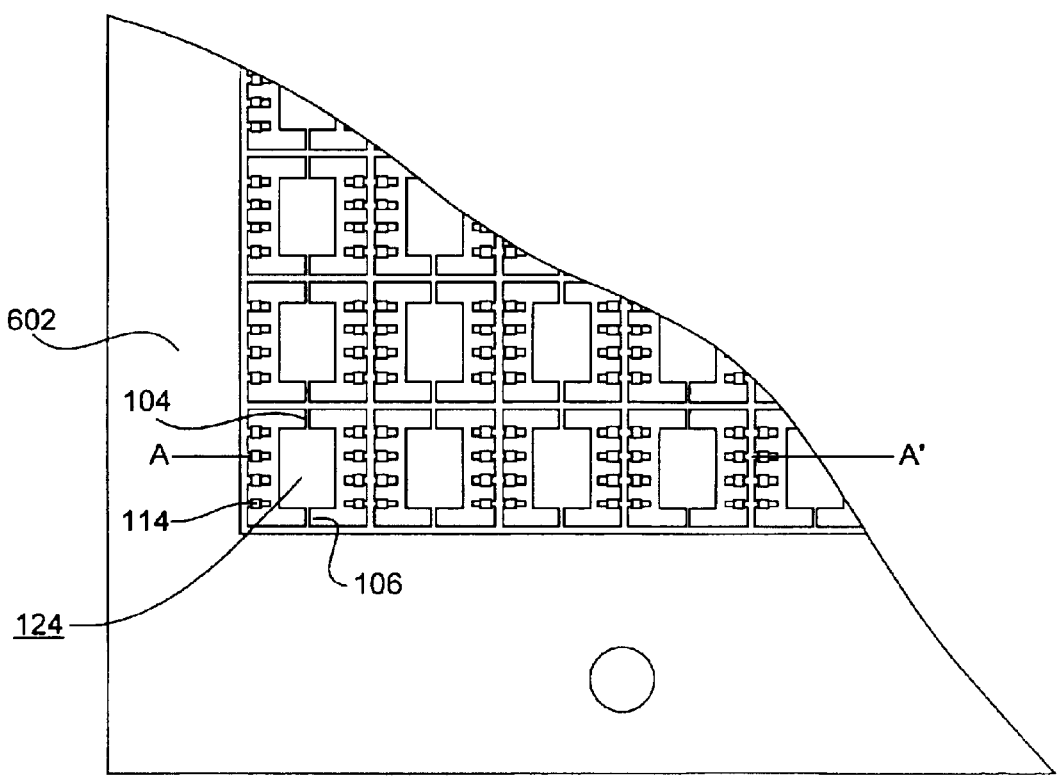
FIG. 7 is a magnified view of a part of the lead frame strip shown in FIG. 7.
Figure 8A:
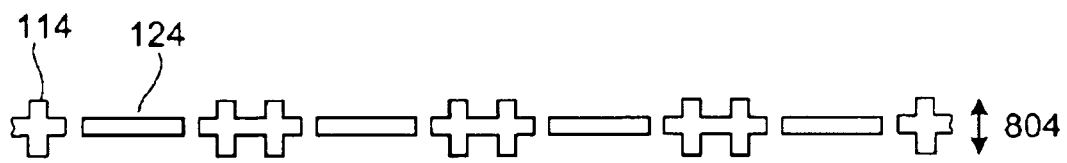
FIGS. 8A to 8D are schematic cross sectional side views illustrating steps in a method of making packages according to the present invention.
Figure 8B:
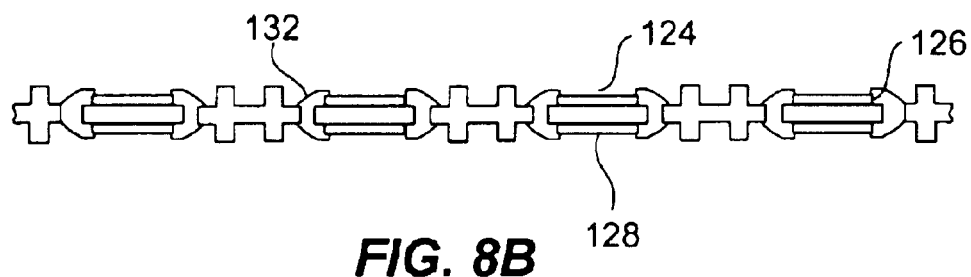
Figure 8C:
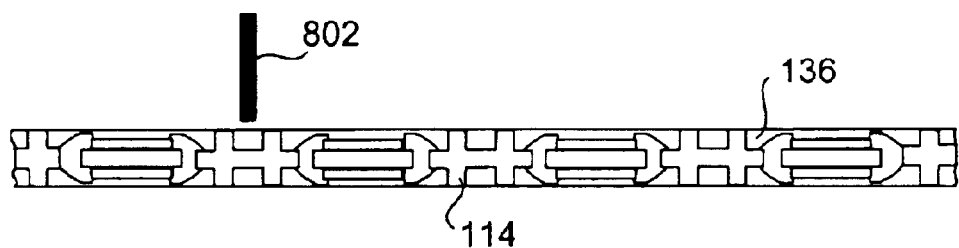
Figure 8D:

A method of manufacturing a package will now be described with reference to FIGS. 6, 7 and 8A to 8D. FIG. 6 shows a lead frame strip 600 having a plurality of six by six arrays 602, 604, 606 of lead frames for the individual packages. FIG. 7 is a magnified view of the lower left hand corner of lead frame strip 600. The lead frame for each package includes the leads 114, and the die attach pad 124 connected to the lead frame by ties 104, 106. The lead frame strip is made by appropriately patterning a strip of approximately 40 mm thick copper and then etching the strip from both sides to a thickness 804 of approximately 3 mm. FIG. 8A shows a cross sectional view through four items of the array 604 along line AA'. After the lead frame has been etched, dice 124, 128 are attached using epoxy 126 to each side of each of the die attach pads 124. The dice are then wire bonded 132 to the leads 114 using thermal sonic bonding. The packages are then formed by encapsulation in a packaging material 136 using conventional molding techniques or methods. The ends of the leads 114 are exposed at each surface of the packages. The mold clamps the lead frame during the molding stage and prevents mold compound from covering the ends of the leads. In the event that there is any bleed of mold compound onto the surface it can be chemically removed. The individual packages 804, 806, 808, 810 are then separated by using a saw 802 in a singulating step.

Although the foregoing invention has been described in some detail for purposes of clarity of understanding, it will be apparent that certain changes and modifications may be practiced within the scope of the appended claims. Some of the features of the various embodiments may be combined with features of other of the embodiments. Therefore, the described embodiments should be taken as illustrative and not restrictive, and the invention should not be limited to the details given herein but should be defined by the following claims and there full scope of equivalents.

What is claimed is:

1. A package comprising:

a lead frame including a die attach pad and a plurality of leads, the die attach pad having a first and second sides, wherein at least some of the leads have a shelf portion and first and second contact post portions that extend above and below the shelf portion and are thicker than the die attach pad;

a semiconductor die mounted on the first side of the die attach pad;

an electrical connection between the semiconductor die and the first lead; and packaging material encapsulating the semiconductor die into the package, wherein the package has a first side and a second side, the first and second sides being opposed, and the first and second contact posts are exposed at the first and second sides of the package.

2. A packaged semiconductor device comprising:

a lead frame including a die attach pad and a plurality of leads, wherein at least some of the leads have a shelf portion and first and second contact post portions that extend above and below the shelf portion and are thicker than the die attach pad;

a semiconductor die mounted on a first surface of the die attach pad;

a plurality of bonding wires that electrically connect the die to the shelf portions of associated leads; and a packaging material that encapsulates the semiconductor die and the bonding wires, while leaving the contact posts exposed to form contacts on opposing sides of the packaged semiconductor device.

3. A packaged semiconductor device as recited in claim 2, further comprising a second die mounted on a second surface of the die attach pad such that the first and second dies are mounted on opposite sides of the die attach pad, wherein the second die is electrically connected to at least some of the leads.

4. A plurality of packaged semiconductor devices as recited in claim 2, wherein the packaged semiconductor devices are stacked with at least some of the respective contacts of an adjacent pair of packages in electrical contact.

5. A plurality of packaged semiconductor devices as recited in claim 2 wherein the die attach pad and the shelves are substantially the same thickness and are substantially co-planar.

6. A plurality of packaged semiconductor devices as recited in claim 5 wherein the height of the contact posts above the shelves is greater than the combined height of the die and the bonding wires above the first surface of the die attach pad.

7. A method of packaging semiconductor devices comprising:

providing a lead frame panel having a plurality of device areas, wherein each device area includes a die attach pad and a plurality of leads, wherein at least some of the leads have a shelf portion and first and second contact post portions that extend above and below the shelf portion and are thicker than the die attach pad;

mounting a plurality of semiconductor dice on the lead frame panels, wherein each die is mounted on an associated die attach pad;

electrically connecting the die to at least some of the leads; and encapsulating the semiconductor die with a packaging material while leaving the contact posts exposed to form contacts on opposing sides of a packaged semiconductor device.

8. The method of claim 7, further comprising singulating each packaged semiconductor device from the lead frame panel after encapsulation.

9. The method of claim 7, wherein some of the semiconductor dice are mounted on a first side of their associated die attach pad and some of the semiconductor dice are mounted on a second side of their associated die attach pad.

10. A lead frame panel suitable for use in semiconductor packaging, the lead frame panel comprising at least one two dimensional area of device areas, each device area including a die attach pad and a plurality of leads, wherein at least some of the leads have a shelf portion that is substantially the same thickness as the die attach pad and first and second contact post portions that extend above and below their associated shelf portions and are thicker than their associated die attach pads.

11. A lead frame panel as recited in claim 10 wherein:

the panel has a plurality of two dimensional arrays of device areas;

each two dimensional array of device areas includes a two dimensional matrix of tie bars; and immediately adjacent device areas within a particular two dimensional array of device areas are separated only by a single tie bar in the two dimensional matrix of tie bars.

12. A lead frame panel as recited in claim 10 wherein each device area further comprises at least one tie that couples the associated die attach pad to an associated tie bar.

13. A support panel comprising:

a lead frame panel as recited in claim 10; and a plurality of semiconductor dice, each semiconductor die being mounted on an associated die attach pad of an associated device area; and wherein the contact posts on a particular side of the lead frame panel extend above the height of any dice mounted on the same side of the lead frame panel.

14. A support panel as recited in claim 13 further comprising:

a plurality of bonding wires that electrically connect the die to the shelf portions of associated leads; and a packaging material that encapsulates the semiconductor dice and the bonding wires, while leaving the contact posts exposed to form contacts on opposing sides of the support panel.

15. A support panel as recited in claim 14 wherein each die attach pad has a pair of dice mounted on opposite sides of the die attach pad.

* * * * *